(12) United States Patent
Lu et al.

(10) Patent No.: US 11,558,043 B2
(45) Date of Patent: Jan. 17, 2023

(54) VOLTAGE ADJUST CIRCUIT AND OPERATION METHOD THEREOF

(71) Applicant: AU Optronics Corporation, Hsin-Chu (TW)

(72) Inventors: Yi-Chen Lu, Hsin-Chu (TW); Hsu-Chi Li, Hsin-Chu (TW); Yi-Jan Chen, Hsin-Chu (TW); Boy-Yiing Jaw, Hsin-Chu (TW); Chin-Tang Chuang, Hsin-Chu (TW); Chung-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/516,730

(22) Filed: Nov. 2, 2021

(65) Prior Publication Data
US 2022/0368320 A1   Nov. 17, 2022

(30) Foreign Application Priority Data

May 12, 2021 (TW) ................................. 110117123

(51) Int. Cl.
*H03K 5/00* (2006.01)
*H03K 5/02* (2006.01)
*H03K 19/0175* (2006.01)

(52) U.S. Cl.
CPC .............. *H03K 5/02* (2013.01); *H03K 5/023* (2013.01); *H03K 19/017509* (2013.01)

(58) Field of Classification Search
None
See application file for complete search history.

(56) References Cited

U.S. PATENT DOCUMENTS

| 7,227,400 B1* | 6/2007 | Gillespie .......... H03K 19/00315 327/333 |
| 9,893,730 B1* | 2/2018 | Ucar ....................... H04L 25/49 |
| 9,948,283 B2* | 4/2018 | Takayanagi ...... H03K 3/356113 |
| 10,686,434 B2 | 6/2020 | Chern et al. |
| 10,784,843 B2* | 9/2020 | Hsu ....................... H03K 3/0375 |
| 2005/0184768 A1* | 8/2005 | Pilling ............. H03K 19/01707 327/112 |

(Continued)

FOREIGN PATENT DOCUMENTS

TW    I675273 B    10/2019

OTHER PUBLICATIONS

Zhicong Luo et al., A High-Voltage-Tolerant and Precise Charge-Balanced Neuro-Stimulator in Low Voltage CMOS Process, IEEE Transactions on Biomedical Circuits and Systems, 2015 IEEE (ref.01, file attached).

*Primary Examiner* — Tuan T Lam
(74) *Attorney, Agent, or Firm* — WPAT, PC

(57) ABSTRACT

The disclosure provides a voltage adjust circuit. The voltage adjust circuit includes a buffer circuit, a bias circuit, a level shifter and a cross voltage limit circuit. The buffer circuit includes a plurality of pull-up transistors and a plurality of pull-down transistors. The pull-up transistors coupled in series between an output terminal of the circuit and a high voltage system terminal. The pull-down transistors coupled in series between the output terminal and a low voltage system terminal. The cross voltage limit circuit is configured to limit transient and static bias voltages across two terminals of the pull-up transistors or the pull-down transistors.

19 Claims, 4 Drawing Sheets

(56) References Cited

U.S. PATENT DOCUMENTS

| | | |
|---|---|---|
| 2010/0001787 A1 | 1/2010 | Brunsilius et al. |
| 2011/0025380 A1* | 2/2011 | Kim ................. H03K 3/356113 |
| | | 327/108 |
| 2011/0025407 A1 | 2/2011 | Brunsilius et al. |
| 2014/0002146 A1* | 1/2014 | Kim ............... H03K 19/018521 |
| | | 327/333 |
| 2018/0109255 A1* | 4/2018 | Lee ................ H03K 19/017509 |

* cited by examiner

VOLTAGE ADJUST CIRCUIT AND OPERATION METHOD THEREOF

CROSS-REFERENCE TO RELATED APPLICATION

This application claims priority to Taiwan Application Serial Number 110117123, filed May 12, 2021 which is herein incorporated by reference in its entirety.

BACKGROUND

Field of Invention

The disclosure relates to a voltage adjust circuit, particularly to a voltage adjust circuit enable to provide dynamic voltages.

Description of Related Art

With development of technology, the circuits in the electric device generally operates with voltage swing signals, the domain of the low voltage swing signals is smaller than the domain suitable for the external circuit. Therefore, how to convert the low voltage swing signals to high voltage swing signals and increase the domain of the output voltage of the voltage adjust circuit is an important issue in this field.

SUMMARY

One aspect of the present disclosure is to provide a voltage adjust circuit. The voltage adjust circuit includes a buffer circuit, a level shifter, a bias circuit and a cross-voltage-suppression circuit. The buffer circuit includes a plurality of pull-up transistors and a plurality of pull-down transistors. The pull-up transistors are electrically coupled between an output terminal of the voltage adjust circuit and a system high voltage terminal. The pull-down transistors are electrically coupled between the output terminal of the voltage adjust circuit and a system low voltage terminal. The level shifter is configured to generate a plurality of control signals according to a input signal. The bias circuit is electrically coupled between the level shifter and the buffer circuit. The bias circuit is configured to successively enable the pull-up transistors or the pull-down transistors according to the control signals, such that a voltage level of the output terminal is switched between a voltage level of the system high voltage terminal and a voltage level of the system low voltage terminal. The level shifter is configured to generate a plurality of control signals according to a input signal. The bias circuit is electrically coupled between the level shifter and the buffer circuit. The bias circuit is configured to successively enable the pull-up transistors or the pull-down transistors according to the control signals, such that a voltage level of the output terminal is switched between a voltage level of the system high voltage terminal and a voltage level of the system low voltage terminal. The cross-voltage-suppression circuit is electrically coupled to the pull-up transistors and the pull-down transistors. The cross-voltage-suppression circuit is configured to suppress transient and static voltage stress between two terminals of the pull-up transistors or the pull-down transistors in response to switching the voltage level of the output terminal between the voltage level of the system high voltage terminal and the voltage level of the system low voltage terminal.

Another aspect of the present disclosure is to provide a method for operating a voltage adjust circuit including a buffer circuit. The buffer circuit includes a plurality of pull-up transistors electrically coupled in series between a system high voltage terminal and a output terminal of the voltage adjust circuit and a plurality of the pull-down transistors electrically coupled in series between the output terminal of the voltage adjust circuit and a system low voltage terminal. The method includes the following steps. An input signal is provided. A plurality of control signals are generated according to the input signal. The pull-up transistors and the pull-down transistors are successively enabled according to the control signals, such that a voltage level of the output terminal is switched between a voltage level of the system high voltage terminal and a voltage level of the system low voltage terminal. In response to switching the voltage level of the output terminal between the voltage level of the system high voltage terminal and the voltage level of the system low voltage terminal, transient and static voltage stress between two terminals of the pull-up transistors or the pull-down transistors can be suppressed.

The other aspect of the present disclosure is to provide a method for operating a voltage adjust circuit including a buffer circuit. The buffer circuit includes a plurality of pull-up transistors electrically coupled in series between a system high voltage terminal and a output terminal of the voltage adjust circuit and a plurality of the pull-down transistors electrically coupled in series between the output terminal of the voltage adjust circuit and a system low voltage terminal. The method includes the following steps. An input signal is provided. A plurality of control signals are generated according to the input signal. A plurality of dynamic bias voltages are generated according to the control signals.

One of the pull-up transistors closest to the system high voltage terminal is enabled according to one of the dynamic bias voltages. One of the pull-down transistors closest to the system low voltage terminal is enabled according to another of the dynamic bias voltages.

In summary, the voltage adjust circuit utilizes the cross-voltage-suppression circuit to suppress the transient current in response to switching the voltage of the output terminal.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other. In the following description and in the claims, the terms "include" and "comprise" are used in an open-ended fashion, and thus should be interpreted to mean "include, but not limited to." As used herein, the term "and/or" includes any and all combinations of one or more of the associated listed items.

Figure 1:
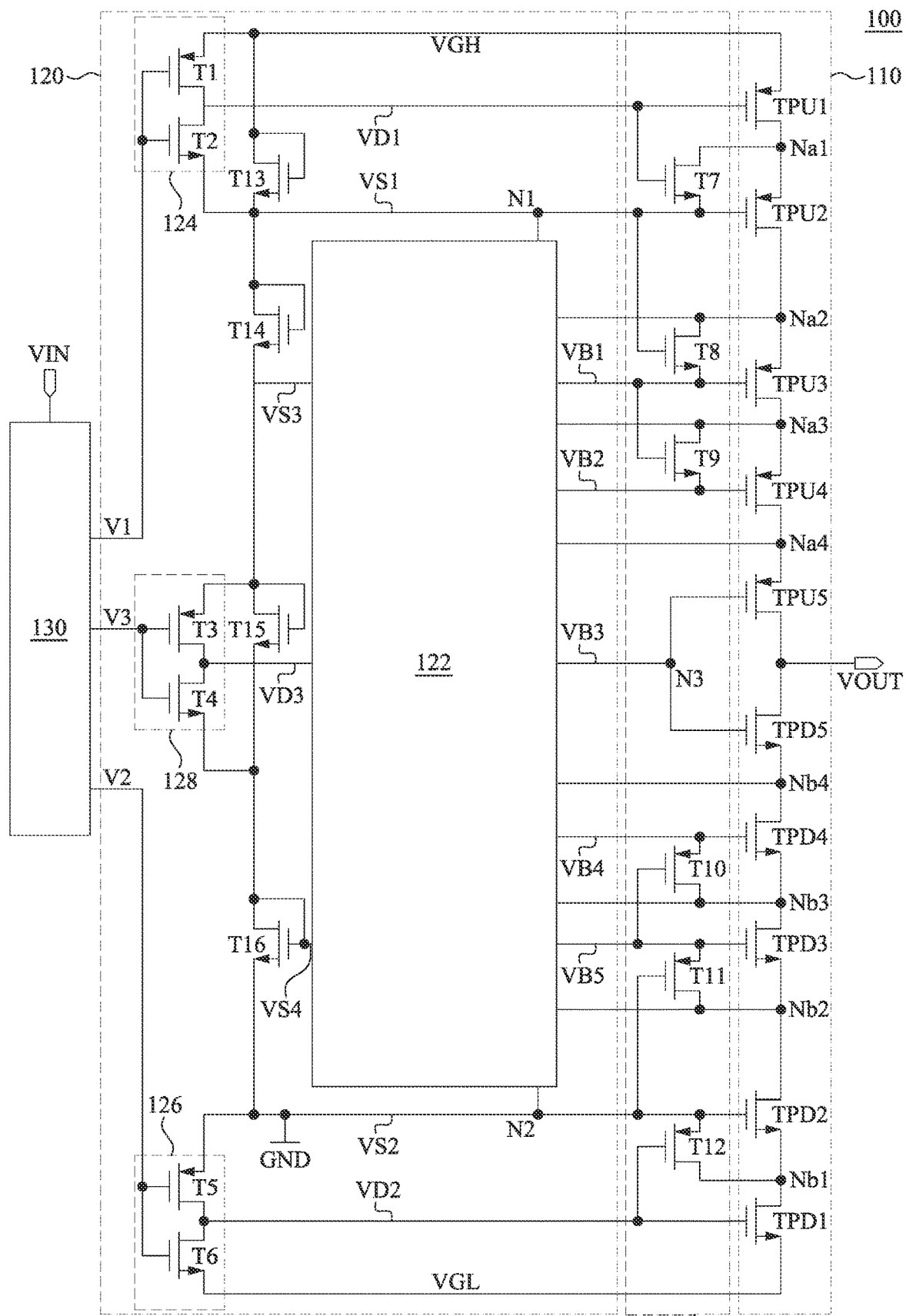
FIG. 1 is a schematic diagram illustrating a voltage adjust circuit in accordance with some embodiments of the disclosure.

Please refer to FIG. 1. FIG. 1 is a schematic diagram illustrating a voltage adjust circuit 100 in accordance with some embodiments of the disclosure. As shown in FIG. 1, the voltage adjust circuit 100 includes a buffer circuit 110, a bias circuit 120, a level shifter 130 and a cross-voltage-suppression circuit 140. The buffer circuit 110 includes pull-up transistors TPU1~TPU5 and pull-down transistors TPD1~TPD5. The pull-up transistors TPU1~TPU5 are electrically coupled in series between a system high voltage terminal VGH and a output terminal VOUT of the voltage adjust circuit 100, and the pull-down transistors TPD1~TPD5 are electrically coupled in series between the output terminal VOUT of the voltage adjust circuit 100 and a system low voltage terminal VGL.

In some embodiments, the voltage adjust circuit 100 can be applied to the display device (not shown), such as the voltage adjust circuit 100 can be applied to the scan driver or the gate driver of the display device. For example, if the voltage adjust circuit 100 is applied to the scan driver, the voltage adjust circuit 100 is configured to generate corresponding output signal to the output terminal VOUT according to the input signal VIN. The output terminal VOUT can be coupled to scan lines of the display device. The voltage adjust circuit 100 can transform the input signal VIN with relatively small range of the voltage variation (such as, the rage of 0 volts to 3 volts) to the output signal with relatively large range of the voltage variation (such as, the rage of −3 volts to 12 volts), and output the output signal to the output terminal VOUT, so as to provide output signal with enough range of the voltage variation to the scan line of the display device to drive the display device with the better performance. How to transform the input signal VIN with relatively small range of the voltage variation to the output signal with relatively large range of the voltage variation outputted from the output terminal VOUT will be described in detailed in the following embodiment.

The voltage adjust circuit 100 has the system high voltage terminal VGH carried on relative high voltage and the system low voltage terminal VGL carried on relative low voltage. The voltage adjust circuit 100 utilized the dynamic bias voltages VD1 and VD2, the static bias voltages VS1 and VS2 and the inner bias voltage VB1~VB5 to control the pull-up transistors TPU1~TPU5 and the pull-down transistors TPD1~TPD5 in the buffer circuit 110, so as to switch the voltage level of the output terminal VOUT between the voltage level of the system high voltage terminal VGH and the voltage level of the system low voltage terminal VGL.

In the present disclosure, the N-type transistors in the voltage adjust circuit 100 can be implemented by N-type metal oxide semiconductor with deep N well. In the voltage adjust circuit 100, the deep N well of the N MOS is electrically coupled to the system high voltage terminal VGH, such that the PN junction between the P-type substrate and the deep N well can be avoid from conducting current in forward direction. The PN junction between the P well and the deep N well can be also avoid from conducting current in forward direction. As a result, the cross voltage of the PN junction of each N-type transistors will be within the allowable range. Therefore, if the voltage level of the system low voltage terminal VGL of the voltage adjust circuit 100 is set at negative value, such as −3 volts, N-type transistors can afford the cross voltage in the voltage adjust circuit 100, in order to avoid the breakdown of the PN junction of the N-type transistors. In addition, the source terminal and the base terminal of each N-type transistors in the present disclosure are coupled to each other, to decrease the body effect.

As the aforementioned embodiments, in the present disclosure, the voltage level of the system low voltage terminal VGL can be set at −3 volts, and the voltage level of the system high voltage terminal VGH can be set at 12 volts, such that the voltage level of the output terminal VOUT can be switched between −3 volts and 12 volts.

In some embodiments, the difference between the voltage level of the system low voltage terminal VGL and the voltage level of the system high voltage terminal VGH can be multiple of number of the pull-up transistors TPU1~TPU5 or the pull-down transistors TPD1~TPD5. In other words, the voltage level of the system low voltage terminal VGL and the voltage level of the system high voltage terminal VGH can be set at the other values. Therefore, it is not intended to limit the present disclosure.

In some embodiment, the voltage level of the output terminal VOUT of the voltage adjust circuit 100 can be utilized to drive the driving circuits of each pixels in the display device. Generally, the buffer circuit only provides the voltage level greater than 0 volts to the driving circuits. In the present disclosure, the buffer circuit 110 of the voltage adjust circuit 100 enable to provide the output with voltage level within −3 volts to 12 volts to increase the voltage operation range of the driving circuit, so as to increase the maximum brightness of the light emitting elements.

The bias circuit 120 is electrically coupled between the level shifter 130 and the cross-voltage-suppression circuit 140. The bias circuit 120 is configured to enable the pull-up transistor TPU1 or the pull-down transistor TPD1 of the buffer circuit 110 according to the control signals V1, V2 and V3, such that the voltage level of the output terminal VOUT can be switched between the voltage level of the system high voltage terminal VGH and the voltage level of the system low voltage terminal VGL. The bias circuit 120 includes a first switch 124, a second switch 126, a third switch 128, a voltage divider transistors T13~T16 and an inner bias circuit 122. The voltage divider transistors T13~T16 are electrically coupled in series between the system high voltage terminal VGH and a grounded terminal GND. The gate terminal and the drain terminal of each voltage divider transistors T13~T16 are coupled to each other. In other words, since the gate terminal and the first terminal (drain terminal) of the voltage divider transistor T13 is electrically coupled to the system high voltage terminal VGH, when the second terminal of the voltage divider transistor T13 has a relatively low voltage level, the voltage divider transistor T13 will turn on to transmit the voltage of the system high voltage terminal VGH to the second terminal of the voltage divider transistor T13 until a voltage difference between the second terminal (the source terminal) and the gate terminal of the voltage divider transistor T13 is equal to the threshold voltage of the voltage divider transistor T13. The operation of the voltage divider transistors T14~T16 are similar with the aforementioned operation of the voltage divider transistor T13, and thus the description is omitted.

In some embodiments of the present disclosure, the threshold voltages of the voltage divider transistors T13~T16 can be 3 volts, and the voltage level of the system high voltage terminal VGH can be 12 volts. The voltage level of grounded terminal GND can be 0 volt, and the four voltage divider transistors T13~T16 can respectively provide a first static bias voltage VS1 with the voltage level of 9 volts, a third static bias voltage VS3 with the voltage level of 6 volts, a fourth static bias voltage VS4 with the voltage level of 3 volts, a second static bias voltage VS2 with the voltage level of 0 volts.

In structure, a first terminal of the voltage divider transistor T13 is electrically coupled to the system high voltage terminal VGH, a second terminal of the voltage divider transistor T13 is electrically coupled to a first terminal of the voltage divider transistor T14. A second terminal of the voltage divider transistor T14 is electrically coupled to a first terminal of the voltage divider transistor T15. A second terminal of the voltage divider transistor T15 is electrically coupled to a first terminal of the voltage divider transistor T16. A second terminal of the voltage divider transistor T16 is electrically coupled to the grounded terminal GND.

The level shifter 130 is configured to receive an input signal VIN, and the level shifter 130 generates the control signals V1, V2 and V3 according to the input signal VIN. The level shifter 130 provides the control signals V1, V2 and V3 to the first switch 124, the second switch 126 and the third switch 128, respectively.

The first switch 124, the second switch 126 and the third switch 128 is electrically coupled between the system high voltage terminal VGH and the system low voltage terminal VGL. The first switch 124 is electrically coupled between the system high voltage terminal VGH and the second terminal of the voltage divider transistor T13 (node N1).

The first switch 124 includes transistors T1 and T2. A first terminal of the transistor T1 is electrically coupled to the system high voltage terminal VGH, a second terminal of second terminal of is electrically coupled to a first terminal of the transistor T2, and a gate terminal of the transistor T1 is electrically coupled to a gate terminal of the transistor T2. A second terminal of the transistor T2 is electrically coupled to the node N1. The gate terminals of the transistor T1 and the transistor T2 are configured to receive the control signal V1.

The first switch 124 is configured to turn on one of the transistors T1 and T2, and turn off the other one of the transistors T1 and T2 to provide the voltage of the system high voltage terminal VGH or the first static bias voltage VS1 to the gate terminal of the pull-up transistor TPU1. In other words, the first switch 124 generates a first dynamic bias voltage VD1 which varied/switched between the voltage of the system high voltage terminal VGH or the voltage of the first static bias voltage VS1 according to the control signal V1, and the first switch 124 provides the first dynamic bias voltage VD1 to the gate terminal of the pull-up transistor TPU1.

The second switch 126 includes the transistors T5 and T6. A first terminal of the transistor T5 is electrically coupled to a second terminal of the voltage divider transistor T16, a second terminal of the transistor T5 is electrically coupled to a first terminal of the transistor T6 and a gate terminal of the pull-down transistor TPD1. A gate terminal of the transistor T5 is electrically coupled to a gate terminal of the transistor T6. A second terminal of the transistor T6 is electrically coupled to the system low voltage terminal VGL. The gate terminals of the transistor T5 and the transistor T6 are configured to receive the control signal V2.

The second switch 126 is electrically coupled between a second terminal of the voltage divider transistor T16 (the node N2) and the system low voltage terminal VGL. The second switch 126 is configured to turn on one of the transistors T5 and T6, and to turn off the other one of the transistors T5 and T6, so as to provide the second static bias voltage VS2 or the voltage of the system low voltage terminal VGL to the gate terminal of the pull-down transistor TPD1. In other words, the second switch 126 generates a second dynamic bias voltage VD2 which is varied/switched between the voltage of the second static bias voltage VS2 and the voltage of the system low voltage terminal VGL, and the second switch 126 provides the second dynamic bias voltage VD2 to the gate terminal of the pull-down transistor TPD1.

The third switch 128 includes the transistors T3 and T4. A first terminal of the transistor T3 is electrically coupled to a second terminal of the voltage divider transistor T14, and a second terminal of the transistor T3 is electrically coupled to a first terminal of the transistor T4 and the inner bias circuit 122. A gate terminal of the transistor T3 is electrically coupled to a gate terminal of the transistor T4. A second terminal of the transistor T4 is electrically coupled to a first terminal of the voltage divider transistor T16. The gate terminals of the transistors T3 and T4 are configured to receive the control signal V3.

The third switch 128 is electrically coupled between a second terminal of the voltage divider transistor T14 and a first terminal of the voltage divider transistor T16. The third switch 128 is configured to turn on one of the transistors T3 and T4, and to turn off the other one of the transistors T3 and T4 to provide the third static bias voltage VS3 or the fourth static bias voltage VS4 to the inner bias circuit 122 according to the control signal V3. In other words, the third switch 128 generates a third dynamic bias voltage VD3 which is varied/switched between the voltage of the third static bias voltage VS3 and the voltage of the fourth static bias voltage VS4 according to the control signal V3, and the third switch 128 provides the third dynamic bias voltage VD3 to the inner bias circuit 122.

The bias circuit 120 further includes an inner bias circuit 122. The inner bias circuit 122 is electrically coupled between nodes N1 and N2. The inner bias circuit 122 provides inner bias voltages VB1~VB5 to the buffer circuit 110. The structure and the operation of the inner bias circuit 122 will be described in detailed in the following embodiments.

The pull-up transistors TPU1~TPU5 and the pull-down transistors TPD1~TPD5 of the buffer circuit 110 are successively enabled according to the first dynamic bias voltage VD1, the first static bias voltage VS1, the second dynamic bias voltage VD2, the second static bias voltage VS2 and the inner bias voltages VB1~VB5. Furthermore, the one of the pull-up transistors TPU1~TPU5 closest to the system high voltage terminal VGH (such as, the pull-up transistor TPU1) is enabled according to the first dynamic bias voltage VD1. The one of the pull-down transistor TPD1~TPD5 closest to the system low voltage terminal VGL (such as, the pull-down transistor TPD1) is enabled according to the second dynamic bias voltage VD2.

Specifically, a first terminal of the pull-up transistor TPU1 is electrically coupled to the system high voltage terminal VGH, and a second terminal of the pull-up transistor TPU1 is electrically coupled to a first terminal of the pull-up transistor TPU2. A gate terminal of the pull-up transistor TPU1 is configured to receive the first dynamic bias voltage VD1. A second terminal of the pull-up transistor TPU2 is electrically coupled to a first terminal of the pull-up transistor TPU3. A gate terminal of the pull-up transistor TPU2 is configured to receive the first static bias voltage VS1. A second terminal of the pull-up transistor TPU3 is electrically coupled to a first terminal of the pull-up transistor TPU4, and a gate terminal of the pull-up transistor TPU3 is configured to receive the inner bias voltage VB1. A second terminal of the pull-up transistor TPU4 is electrically coupled to a first terminal of the pull-up transistor TPU5, and a gate terminal of the pull-up transistor TPU4 is configured to receive the inner bias voltage VB2. A second terminal of the pull-up transistor TPU5 is electrically coupled to the output terminal VOUT of the voltage adjust circuit 100, and a gate terminal of the pull-up transistor TPU5 is configured to receive the inner bias voltage VB3. And, the nodes Na1~Na4 are the connection points positioned at any adjacent two of the pull-up transistors TPU1~TPU4, respectively.

A first terminal of the pull-down transistor TPD1 is electrically coupled to the system low voltage terminal VGL, and a second terminal of the pull-down transistor TPD1 is electrically coupled to a first terminal of the pull-down transistor TPD2. A gate terminal of the pull-down transistor TPD1 is configured to receive the second dynamic bias voltage VD2. A second terminal of the pull-down transistor TPD2 is electrically coupled to a first terminal of the pull-down transistor TPD3, and a gate terminal of the pull-down transistor TPD2 is configured to receive the second static bias voltage VS2. A second terminal of the pull-down transistor TPD3 is electrically coupled to a first terminal of the pull-down transistor TPD4, and a gate terminal of the pull-down transistor TPD3 is configured to receive the inner bias voltage VB5. A second terminal of the pull-down transistor TPD4 is electrically coupled to a first terminal of the pull-down transistor TPD5, and a gate terminal of the pull-down transistor TPD4 is configured to receive the inner bias voltage VB4. A second terminal of the pull-down transistor TPD5 is electrically coupled to the output terminal VOUT of the voltage adjust circuit 100, and a gate terminal of the pull-down transistor TPD5 is configured to receive the inner bias voltage VB3. And, the nodes Nb1~Nb4 are the connection points positioned at any adjacent two of the pull-down transistors TPD1~TPD4, respectively.

The cross-voltage-suppression circuit 140 is electrically coupled to the pull-up transistors TPU1~TPU4 and the pull-down transistors TPD1~TPD4. When the voltage of the output terminal VOUT is switch between the voltages of the system high voltage terminal VGH and the system low voltage terminal VGL, the cross-voltage-suppression circuit 140 is configured to suppress transient and static voltage stress between two terminals of each pull-up transistors TPU1~TPU4 or each pull-down transistors TPD1~TPD4. The cross-voltage-suppression circuit 140 includes pull-up-suppression transistors T7~T9 and pull-down-suppression transistors T10~T12.

In structure, the pull-up-suppression transistors T7~T9 are electrically coupled between the source terminal and the gate terminal of each pull-up transistors TPU2~TPU4. The gate terminals of the pull-up-suppression transistor T7~T9 are respectively electrically coupled to the gate terminals of the pull-up transistors TPU1~TPU3.

A drain terminal of the pull-up-suppression transistor T7 coupled to a source terminal of one (the pull-up transistor TPU2) of the adjacent two pull-up transistors TPU1 and TPU2, and a source terminal of the pull-up-suppression transistor T7 coupled to a gate terminal of the one (the pull-up transistor TPU2) of the adjacent two pull-up transistors TPU1 and TPU2. The gate terminal of the pull-up-suppression transistor T7 coupled to a gate terminal of the other one (the pull-up transistor TPU1) of the adjacent two pull-up transistors TPU1 and TPU2.

A drain terminal of the pull-up-suppression transistor T8 coupled to a source terminal of one (the pull-up transistor TPU3) of the adjacent two pull-up transistors TPU2 and TPU3, and a source terminal of the pull-up-suppression transistor T8 coupled to a gate terminal of the one (the pull-up transistor TPU3) of the adjacent two pull-up transistors TPU2 and TPU3. The gate terminal of the pull-up-suppression transistor T8 coupled to a gate terminal of the other one (the pull-up transistor TPU2) of the adjacent two pull-up transistors TPU2 and TPU3.

A drain terminal of the pull-up-suppression transistor T9 coupled to a source terminal of one (the pull-up transistor TPU4) of the adjacent two pull-up transistors TPU3 and TPU4, and a source terminal of the pull-up-suppression transistor T9 coupled to a gate terminal of the one (the pull-up transistor TPU4) of the adjacent two pull-up transistors TPU3 and TPU4. The gate terminal of the pull-up-suppression transistor T9 coupled to a gate terminal of the other one (the pull-up transistor TPU3) of the adjacent two pull-up transistors TPU3 and TPU4.

Specifically, a first terminal of the pull-up-suppression transistor T7 is electrically coupled to a first terminal of the pull-up transistor TPU2 (the source terminal of the pull-up transistor TPU2), and a second terminal of the pull-up-suppression transistor T7 is electrically coupled to a gate terminal of the pull-up transistor TPU2. A gate terminal of the pull-up-suppression transistor T7 is electrically coupled to a gate terminal of the pull-up transistor TPU1. The gate terminal of the pull-up-suppression transistor T7 is configured to receive the first dynamic bias voltage VD1, and a second terminal of the pull-up-suppression transistor T7 (the source terminal of the pull-up-suppression transistor T7) is configured to receive the first static bias voltage VS1. In other words, the pull-up-suppression transistor T7 is turned on or turned off according to the difference between the first dynamic bias voltage VD1 and the first static bias voltage VS1.

A first terminal of the pull-up-suppression transistor T8 is electrically coupled to a first terminal of the pull-up transistor TPU3 (the source terminal of the pull-up transistor TPU3), and a second terminal of the pull-up-suppression transistor T8 is electrically coupled to a gate terminal of the pull-up transistor TPU3. A gate terminal of the pull-up-suppression transistor T8 is electrically coupled to a gate terminal of the pull-up transistor TPU2. The gate terminal of the pull-up-suppression transistor T8 is configured to receive the first static bias voltage VS1, and the second terminal of the pull-up-suppression transistor T8 (the source terminal of the pull-up-suppression transistor T8) is configured to receive the inner bias voltage VB1. In other words, the pull-up-suppression transistor T8 is turned on or turned off according to the difference between the first static bias voltage VS1 and the inner bias voltage VB1.

A first terminal of the pull-up-suppression transistor T9 is electrically coupled to a first terminal of the pull-up transistor TPU4 (the source terminal of the pull-up transistor TPU4), and a second terminal of the pull-up-suppression transistor T9 is electrically coupled to a gate terminal of the pull-up transistor TPU4. A gate terminal of the pull-up-suppression transistor T9 is electrically coupled to a gate terminal of the pull-up transistor TPU3. The gate terminal of the pull-up-suppression transistor T9 is configured to receive the inner bias voltage VB1, and the second terminal of the pull-up-suppression transistor T9 (the source terminal of the pull-up-suppression transistor T9) is configured to receive the inner bias voltage VB2. In other words, the pull-up-suppression transistor T9 is turned on or turned off according to the difference between the inner bias voltage VB1 and the inner bias voltage VB2.

In structure, the pull-down-suppression transistors T10~T12 are respectively coupled between the source terminal and the gate terminal of each pull-down transistors TPD2~TPD4. The gate terminals of each pull-down-suppression transistors T10~T12 are respectively coupled to the gate terminals of each the pull-down transistors TPD1~TPD3.

A drain terminal of the pull-down-suppression transistor T10 is coupled to the source terminal of one (the pull-down transistor TPD4) of the adjacent two pull-down transistors TPD4 and TPD3, and the source terminal of the pull-down-suppression transistor T10 is coupled to the gate terminal of the one (the pull-down transistor TPD4) of the adjacent two pull-down transistors TPD4 and TPD3. A gate terminal of the pull-down-suppression transistor T10 coupled to the gate terminal of the other one (the pull-down transistor TPD3) of the adjacent two pull-down transistors TPD4 and TPD3.

A drain terminal of the pull-down-suppression transistor T11 is coupled to the source terminal of one (the pull-down transistor TPD3) of the adjacent two pull-down transistors TPD3 and TPD2, and the source terminal of the pull-down-suppression transistor T11 is coupled to the gate terminal of the one (the pull-down transistor TPD3) of the adjacent two pull-down transistors TPD3 and TPD2. A gate terminal of the pull-down-suppression transistor T11 coupled to the gate terminal of the other one (the pull-down transistor TPD2) of the adjacent two pull-down transistors TPD3 and TPD2.

A drain terminal of the pull-down-suppression transistor T12 is coupled to the source terminal of one (the pull-down transistor TPD2) of the adjacent two pull-down transistors TPD2 and TPD1, and the source terminal of the pull-down-suppression transistor T12 is coupled to the gate terminal of the one (the pull-down transistor TPD2) of the adjacent two pull-down transistors TPD2 and TPD1. A gate terminal of the pull-down-suppression transistor T12 coupled to the gate terminal of the other one (the pull-down transistor TPD1) of the adjacent two pull-down transistors TPD2 and TPD1.

Specifically, a first terminal of the pull-down-suppression transistor T10 is electrically coupled to a gate terminal of the pull-down transistor TPD4, and a second terminal of the pull-down-suppression transistor T10 is electrically coupled to a second terminal of the pull-down transistor TPD4 (the source terminal of the pull-down transistor TPD4). A gate terminal of the pull-down-suppression transistor T10 is electrically coupled to a gate terminal of the pull-down transistor TPD3. The first terminal of the pull-down-suppression transistor T10 is configured to receive the inner bias voltage VB4, and the gate terminal of the pull-down-suppression transistor T10 is configured to receive the inner bias voltage VB5. In other words, pull-down-suppression transistor T10 is turned on or turned off according to the difference between the inner bias voltage VB4 and the inner bias voltage VB5.

A first terminal of the pull-down-suppression transistor T11 is electrically coupled to a gate terminal of the pull-down transistor TPD3, and a second terminal of the pull-down-suppression transistor T11 is electrically coupled to a second terminal of the pull-down transistor TPD3 (the source terminal of the pull-down transistor TPD3). A gate terminal of the pull-down-suppression transistor T11 is electrically coupled to a gate terminal of the pull-down transistor TPD2. The first terminal of the pull-down-suppression transistor T11 is configured to receive the inner bias voltage VB5, and the gate terminal of the pull-down-suppression transistor T11 is configured to receive the second static bias voltage VS2. In other words, pull-down-suppression transistor T11 is turned on or turned off according to the difference between the inner bias voltage VB5 and the second static bias voltage VS2.

A first terminal of the pull-down-suppression transistor T12 is electrically coupled to a gate terminal of the pull-down transistor TPD2, and a second terminal of the pull-down-suppression transistor T12 is electrically coupled to a second terminal of the pull-down transistor TPD2 (the source terminal of the pull-down transistor TPD2). A gate terminal of the pull-down-suppression transistor T12 is electrically coupled to a gate terminal of the pull-down transistor TPD1. The first terminal of the pull-down-suppression transistor T12 is configured to receive the second static bias voltage VS2, and the gate terminal of the pull-down-suppression transistor T12 is configured to receive the second dynamic bias voltage VD2. In other words, pull-down-suppression transistor T10 is turned on or turned off according to the difference between the second static bias voltage VS2 and the second dynamic bias voltage VD2.

When the input signal VIN has a first logic level (such as, 0 volts), the voltage adjust circuit 100 utilizes the first dynamic bias voltage VD1 and the third dynamic bias voltage VD3 to successively turn off the pull-up transistors TPU1~TPU5 along the direction from the system high voltage terminal VGH to the output terminal VOUT, and the voltage adjust circuit 100 utilizes the second dynamic bias voltage VD2 to successively turn on the pull-down transistors TPD1~TPD5 along the direction from the system low voltage terminal VGL to the output terminal VOUT, so as to pull down the voltage level of the output terminal VOUT to the voltage level of the system low voltage terminal VGL.

In other words, when the input signal VIN has a first logic level (such as, 0 volts), the pull-up transistors TPU1~TPU5 are turned off according to the first dynamic bias voltage VD1, the first static bias voltage VS1 and a part of the inner bias voltages VB1~VB5, and the pull-down transistors TPD1~TPD5 are turned on according to the second dynamic bias voltage VD2, the second static bias voltage VS2 and the other part of the inner bias voltages VB1~VB5.

When the input signal VIN has a first logic level (such as, 3 volts), the voltage adjust circuit 100 utilizes the first dynamic bias voltage VD1 to successively turn on the pull-up transistors TPU1~TPU5 along the direction from the system high voltage terminal VGH to the output terminal VOUT, and the voltage adjust circuit 100 utilizes the third dynamic bias voltage VD3 and the second dynamic bias voltage VD2 to successively turn off the pull-down transistors TPD1~TPD5 along the direction from the system low voltage terminal VGL to the output terminal VOUT, so as to pull up the voltage level of the output terminal VOUT to the voltage level of the system high voltage terminal VGH.

In other words, when the input signal VIN has a second logic level (such as, 3 volts), the pull-up transistors TPU1~TPU5 are turned on according to the first dynamic bias voltage VD1, the first static bias voltage VS1 and a part of the inner bias voltages VB1~VB5, and the pull-down transistors TPD1~TPD5 are turned off according to the second dynamic bias voltage VD2, the second static bias voltage VS2 and the other part of the inner bias voltages VB1~VB5.

For better understanding, the operation of the voltage adjust circuit 100 will be described in detail in the following embodiments.

Figure 2:
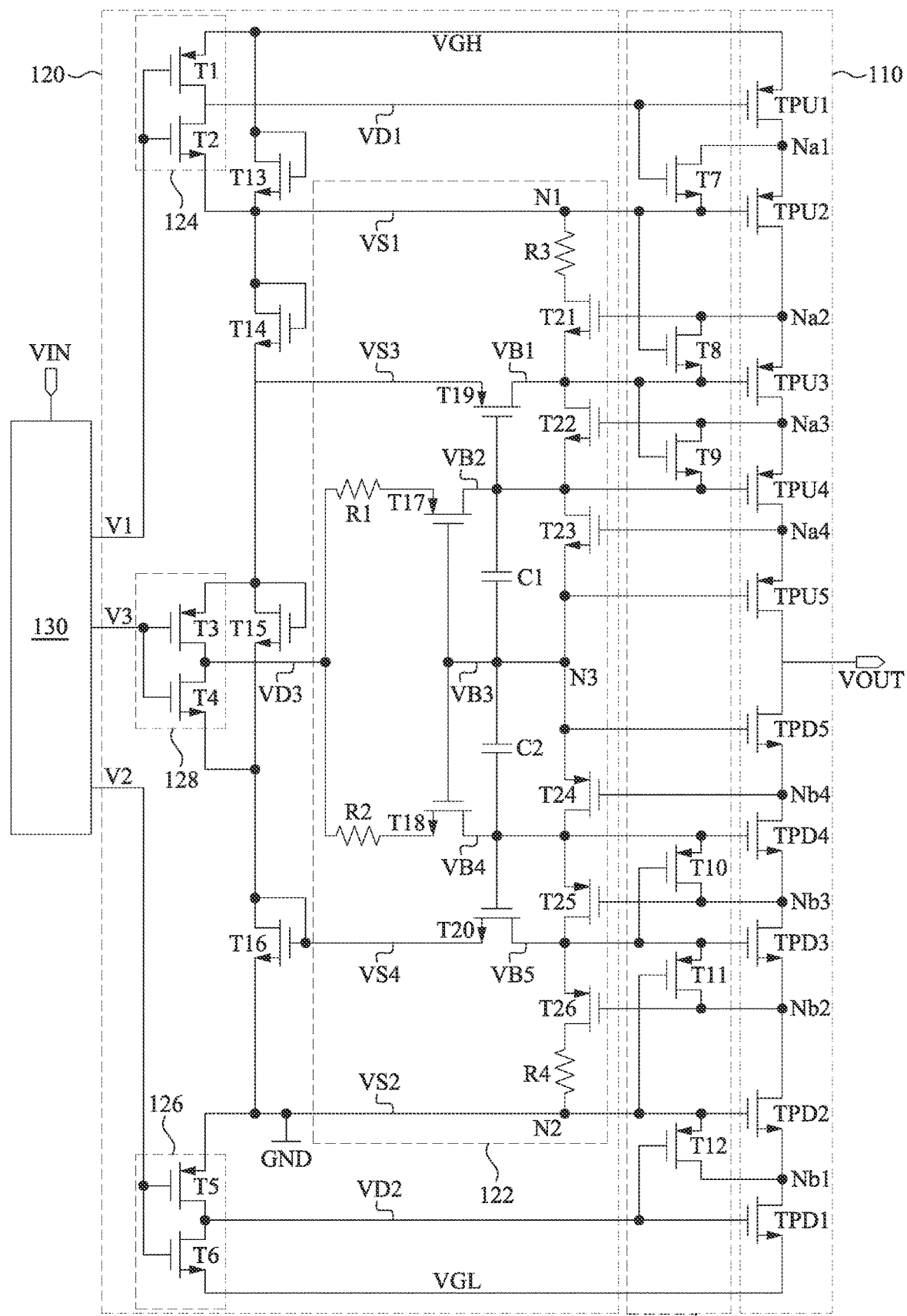
FIG. 2 is a schematic diagram illustrating a voltage adjust circuit in accordance with some embodiments of the disclosure.

Reference is made to FIG. 2. FIG. 2 is a schematic diagram illustrating a voltage adjust circuit 100 in accordance with some embodiments of the disclosure. As shown in FIG. 2, the inner bias circuit 122 includes transistors T17~T26, resistors R1~R4, a first capacitor C1 and a second capacitor C2.

Specifically, the first capacitor C1 is electrically coupled between the gate terminals of two pull-up transistors TPU4~TPU5 of the pull-up transistors TPU1~TPU5 closest to the output terminal VOUT, and the first capacitor C1 is configured to stable the voltages of the gate terminals of two pull-up transistors TPU4~TPU5. A first terminal of the first capacitor C1 is electrically coupled to the gate terminal of the pull-up transistor TPU4, and a second terminal of the first capacitor C1 is electrically coupled to the gate terminal of the pull-up transistor TPU5.

A the first terminal of the resistor R1 is configured to receive the third dynamic bias voltage VD3, and a second terminal of the resistor R1 is electrically coupled to a first terminal of the transistor T17. A second terminal of the transistor T17 is electrically coupled to a gate terminal of the pull-up transistor TPU4. A gate terminal of the transistor T17 is electrically coupled to the node N3. The transistor T17 is configured to provide the inner bias voltage VB2 to the gate terminal of the pull-up transistor TPU4 according to the voltage level of node N3.

A first terminal of the transistor T19 is configured to receive the third static bias voltage VS3, and a second terminal of the transistor T19 is electrically coupled to the gate terminal of the pull-up transistor TPU3. A gate terminal of the transistor T19 is electrically coupled to a first terminal of the capacitor C1. The transistor T19 is configured to provide the inner bias voltage VB1 to the gate terminal of the pull-up transistor TPU3 according to the voltage level of the first terminal of the capacitor C1.

A first terminal of the resistor R3 is electrically coupled to node N1, and a second terminal of the resistor R3 is electrically coupled to a first terminal of the transistor T21. A second terminal of the transistor T21 is electrically coupled to the gate terminal of the pull-up transistor TPU3 and the first terminal of the transistor T22, and a gate terminal of the transistor T21 is electrically coupled to the first terminal of the pull-up transistor TPU3. A second terminal of the transistor T22 is electrically coupled to a gate terminal of the pull-up transistor TPU4 and the first terminal of the transistor T23, and a gate terminal of the transistor T22 is electrically coupled to the first terminal of the pull-up transistor TPU4. A second terminal of the transistor T23 is electrically coupled to the gate terminal of the pull-up transistor TPU5 and node N3, and the gate terminal of the transistor T23 is electrically coupled to the first terminal of the transistor T23. And, node Na4 is the connection point between the pull-up transistors TPU4 and TPU5.

The capacitor C2 is electrically coupled between the gate terminals of two pull-down transistors TPD4~TPD5 of the pull-down transistors TPD1~TPD5 closest to the output terminal VOUT, and the capacitor C2 is configured to stable the voltage level of the gate terminals of two pull-down transistors TPD4~TPD5. A first terminal of the capacitor C2 is electrically coupled to the gate terminal of the pull-down transistor TPD4, and a second terminal of the capacitor C2 is electrically coupled to the gate terminal of the pull-down transistor TPD5.

A first terminal of the resistor R2 is configured to receive the third dynamic bias voltage VD3, and the second terminal of the resistor R2 is electrically coupled to a first terminal of the transistor T18. A second terminal of the transistor T18 is electrically coupled to the gate terminal of the pull-down transistor TPD4, and a gate terminal of the transistor T18 is electrically coupled to node N3. The transistor T18 is configured to provide the inner bias voltage VB4 to the gate terminal of the pull-down transistor TPD4 according to the voltage level of node N3.

A first terminal of the transistor T20 is configured to receive the fourth static bias voltage VS4, and a second terminal of the transistor T20 is electrically coupled to the gate terminal of the pull-down transistor TPD3, and a gate terminal of the transistor T20 is electrically coupled to the second terminal of the capacitor C2. The transistor T20 is configured to provide the inner bias voltage VB5 to the gate terminal of the pull-down transistor TPD3 according to the voltage level of the second terminal of the capacitor C2.

A first terminal of the resistor R4 is electrically coupled to node N2, and a second terminal of the resistor R4 is electrically coupled to a second terminal of the transistor T26. A first terminal of the transistor T26 is electrically coupled to the gate terminal of the pull-down transistor TPD3, and a gate terminal of the transistor T26 is electrically coupled to the second terminal of the pull-down transistor TPD3. A first terminal of the transistor T25 is electrically coupled to the gate terminal the pull-down transistor TPD4 and a second terminal of the transistor T24, and a gate terminal of the transistor T25 is electrically coupled to the second terminal of the pull-down transistor TPD4. A first terminal of the transistor T24 is electrically coupled to the gate terminal of the pull-down transistor TPD5 and node N3, and a gate terminal of the transistor T24 is electrically coupled to the second terminal of the pull-down transistor TPD5. and, node Nb4 is the connection point between he pull-down transistors TPD4 and TPD5.

Figure 3:
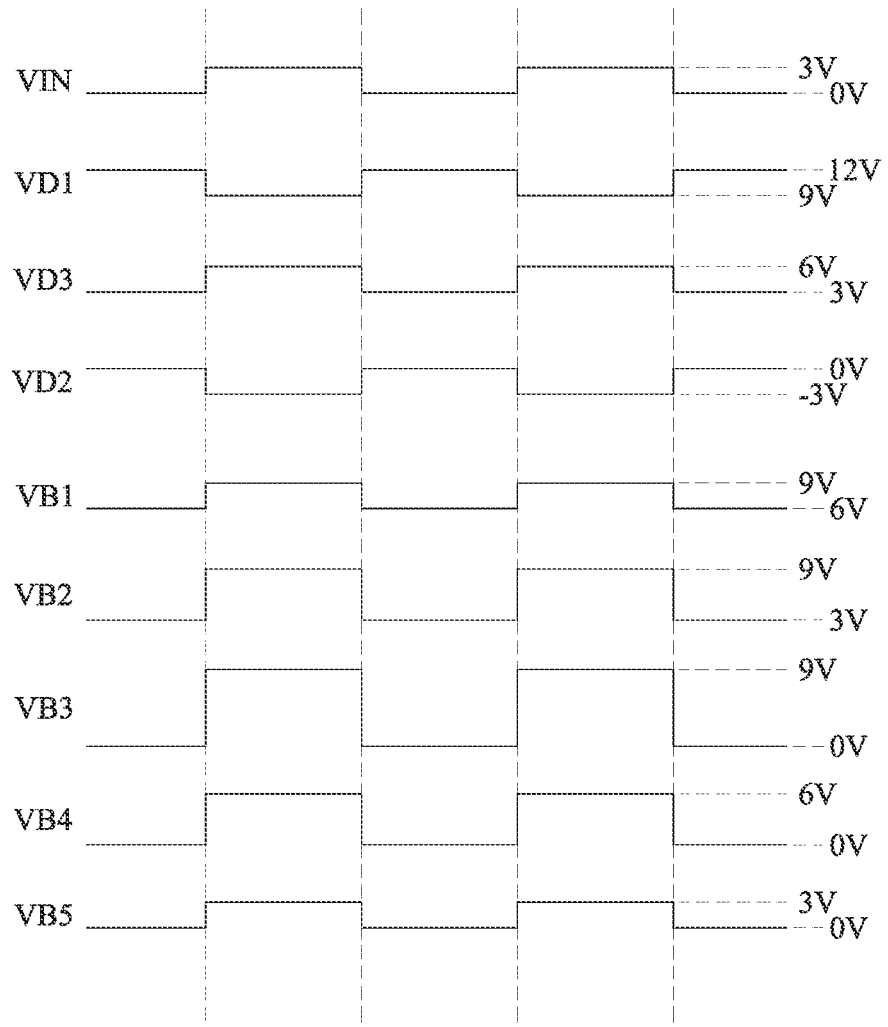
FIG. 3 is a schematic diagram illustrating signals of the voltage adjust circuit in FIG. 2 in accordance with some embodiments of the disclosure.
Figure 4:
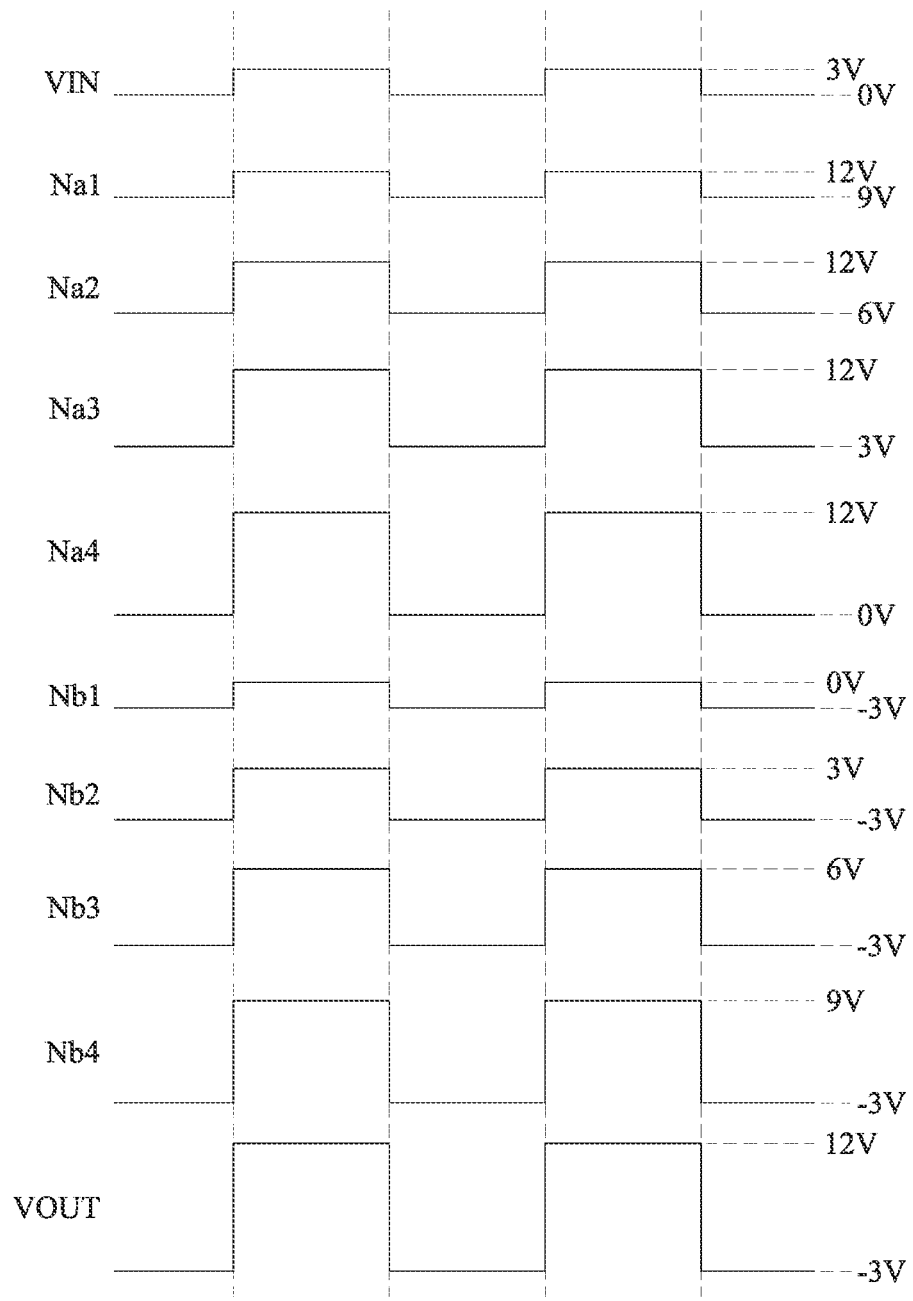
FIG. 4 is a schematic diagram illustrating signals of the voltage adjust circuit in FIG. 2 in accordance with some embodiments of the disclosure.

Reference is also made to FIG. 3 and FIG. 4. FIG. 3 is a schematic diagram illustrating signals of the voltage adjust circuit 100 in FIG. 2 in accordance with some embodiments of the disclosure. FIG. 4 is a schematic diagram illustrating signals of the voltage adjust circuit 100 in FIG. 2 in accordance with some embodiments of the disclosure. FIG. 3 illustrates the input signal VIN, the first dynamic bias voltage VD1, the second dynamic bias voltage VD2, the third dynamic bias voltage VD3 and the inner bias voltages VB1~VB5.

The voltage divider transistors T13~T16 are electrically coupled between the system high voltage terminal VGH and the grounded terminal GND, and the voltage divider transistors T13~T16 are configured to provide the first static bias voltage VS1 with the voltage level of 9 volts, the third static bias voltage VS3 with the voltage level of 6 volts, the fourth static bias voltage VS4 with the voltage level of 3 volts and the second static bias voltage VS2 with the voltage level of 0 volts. Since the first static bias voltage VS1, the third static bias voltage VS3, the fourth static bias voltage VS4 and the second static bias voltage VS2 have constant values, the illustrations in FIG. 3 and FIG. 4 are omitted.

When the input signal VIN is switched from 3 volt to 0 volt, the level shifter 130 respectively provides the control signal V1 with the voltage level of 8.9 volts, the control signal V2 with the voltage level of −3 volts and the control signal V3 with the voltage level of 6.03 volts to the first switch 124, the second switch 126 and the third switch 128.

Meanwhile, the control signal V1, which has the voltage level of 8.9 volts, turn on the transistor T1 and turn off the transistor T2, to transmit the voltage (12 volts) of the system high voltage terminal VGH as the first dynamic bias voltage VD1 to the gate terminal of the pull-up transistor TPU1, so as to turn off the pull-up transistor TPU1. And, since the gate terminal of the pull-up-suppression transistor T7 receives the voltage (12 volts) of the system high voltage terminal VGH, and the source terminal of the pull-up-suppression transistor T7 receives the first static bias voltage VS1, which has the voltage of 9 volts, the pull-up-suppression transistor T7 is turned on. Since the pull-up-suppression transistor T7 is turned on, the voltage level (9 volts) of the source terminal of the pull-up-suppression transistor T7 is transmitted to the source terminal of the pull-up transistor TPU2, so as to turn off the pull-up transistor TPU2 and to suppress the transient current during the pull-down operation of the output signal OUT.

On the other hand, the control signal V2 with the voltage level of −3 volts turn on the transistor T5 and turn off the transistor T6, to transmit the second static bias voltage VS2 with the voltage level of 0 volts to the gate terminal of the pull-down transistor TPD1, such that the pull-down transistor TPD1 is turned on and the pull-down-suppression transistor T12 is turned off. Since the pull-down transistor TPD1 is turned on, the voltage (−3 volts) of the system low voltage terminal VGL is transmitted to the source terminal of the pull-down transistor TPD2, such that the transistor T26 is turned on, and the second static bias voltage VS2 with the voltage level of 0 volts is transmitted to the gate terminal of the pull-down transistor TPD3 to turn on the pull-down transistor TPD3 and turn off the pull-down-suppression transistor T11. Since the pull-down transistor TPD3 is turned on, the voltage (−3 volts) of the system low voltage terminal VGL is transmitted to the second terminal of the pull-down transistor TPD4 and the gate terminal of the transistor T25, such that the transistor T25 is turned on.

Since the transistor T25 is turned on, the second static bias voltage VS2 with the voltage level of 0 volts is transmitted as the inner bias voltage VB4 to the gate terminal of the pull-down transistor TPD4, such that the pull-down transistor TPD4 is turned on an the pull-down-suppression transistor T10 is turned off.

Since the pull-down transistor TPD4 is turned on, the voltage (−3 volts) of the system low voltage terminal VGL is transmitted to the second terminal of the pull-down transistor TPD4 and the gate terminal of the transistor T24, such that the transistor T24 is turned on.

Since transistor T24 is turned on, the second static bias voltage VS2 (0 volts) is transmitted as the inner bias voltage VB3 to t node N3 and the gate terminal of the pull-down transistor TPD5, such that the pull-down transistor TPD5 is turned on, and the voltage (−3 volts) of the system low voltage terminal VGL is transmitted to the output terminal VOUT. As a result, when the input signal VIN is switched from 3 volts to 0 volts, the voltage level of the output terminal VOUT can be switched to the voltage level of the system low voltage terminal VGL, −3 volts.

The transistor T18 is turned off according to the voltage level (0 volts) of node N3, and the transistor T20 is turned off according to the voltage level (0 volts) of the second terminal of the second capacitor C2.

Meanwhile, in the third switch 128, the transistor T4 is turned on and the transistor T3 is turned off according to the control signal V3 with the voltage level 6.03 volts, so as to transmit the fourth static bias voltage VS4 with the voltage level of 3 volts as the third dynamic bias voltage VD3 to the first terminals of the transistors T17 and T18.

The transistor T17 is turned on according to the voltage level (0 volts) of node N3, and the fourth static bias voltage VS4 (3 volts) is transmitted as the inner bias voltage VB2 to the first terminal of the first capacitor C1. The transistor T19 is turned on according to the voltage level (3 volts) of the first terminal of the first capacitor C1, to transmit the third static bias voltage VS3 (6 volts) as the inner bias voltage VB1 to the gate terminal of the pull-up transistor TPU3, so as to turn on the pull-up-suppression transistor T8. Since the pull-up-suppression transistor T8 is turned on, the voltage level (6 volts) of the source terminal of the pull-up-suppression transistor T8 is transmitted to the source terminal of the pull-up transistor TPU3, so as to turn off the pull-up transistor TPU3 and the transistor T21 and to suppress the transient current during the pull-down operation.

Since the inner bias voltage VB2 (3 volts) turns on the pull-up-suppression transistor T9, the voltage (3 volts) of the source terminal of the pull-up-suppression transistor T9 is transmitted to the source terminal of the pull-up transistor TPU4, so as to turn off the pull-up transistor TPU4 and the transistor T22 and to suppress the transient current during the pull-down operation. And, the transistor T23 is turned off according to the voltage level (such as, 0 volts) of node Na4, and the pull-up transistor TPU5 is turned off according to the voltage level (0 volts) of node Na3. As a result, when the input signal VIN is switched from 3 volts to 0 volts, the voltage adjust circuit 100 successively turns off the pull-up transistors TPU1 TPU5 from the system high voltage terminal VGH to the output terminal VOUT according to the first dynamic bias voltage VD1, and successively turns on the pull-down transistors TPD1~TPD5 from the system low voltage terminal VGL to the output terminal VOUT according to the second dynamic bias voltage VD2, in order to switch the voltage level of the output terminal VOUT from 12 volts to −3 volts during the pull-down operation.

The structure of the voltage adjust circuit 100 can be utilized to successively turn off the pull-up transistors TPU1~TPU5 from the system high voltage terminal VGH to the output terminal VOUT, and to suppress the transient current of the voltage level of the output terminal VOUT, in order to increase the reliability of the voltage adjust circuit 100 and to extend the lifetime of the circuit.

Furthermore, during the operation, the cross voltages of each transistors of the voltage adjust circuit 100 will less than 3.1 volts, which is in the allowable rage of 3.6 volts, can also increase the reliability of the voltage adjust circuit 100 and to extend the lifetime of the circuit. Therefore, a part of transistors of the disclosure can be implemented by low voltage transistor, to decrease the circuit area and reduce the manufacturing cost.

As shown in FIG. 3 and FIG. 4, when the input signal VIN is switched from 0 volts to 3 volts, the voltages of the control signal V1, V2 and V3 are respectively 12 volts, 0 volts and 2.92 volts. The first dynamic bias voltage VD1, the second dynamic bias voltage VD2 and the third dynamic bias voltage VD3 are respectively 9 volts, −3 volts and 6 volts. The inner bias voltages VB1~VB5 are respectively 9 volts, 9 volts, 9 volts, 6 volts, 3 volts. Correspondingly, the voltage level of nodes Na1~Na4 are all 12 volts, the voltage level of nodes Nb1~Nb4 are respectively 0 volts, 3 volts, 6 volts, 9 volts. Meanwhile, the voltage adjust circuit 100 can successively turn off the pull-down transistors TPD1~TPD5 from the system low voltage terminal VGL to the output terminal VOUT, and the voltage level of the output terminal VOUT can be switched to the voltage level of the system high voltage terminal VGH, 12 volts, during the pull-up operation.

The operation that the voltage adjust circuit 100 successively turns off the pull-down transistors TPD1~TPD5 is similar with the voltage adjust circuit 100 successively turns off the pull-up transistors TPU1~TPU5, thus the description is omitted.

Summary, in the present disclosure, the voltage adjust circuit 100 utilizes the pull-up-suppression transistors T7~T9 and the pull-down-suppression transistors T10~T12 to suppress the transient current in response to switching the voltage of the output terminal VOUT, and the designed structure the voltage adjust circuit 100 is utilized to decrease the cross voltages of the transistor therein, and the cross voltages of each transistors can be within the allowable rage, in order to increase the reliability of the voltage adjust circuit 100 and to extend the lifetime of the circuit. Furthermore, the voltage adjust circuit 100 utilizes the first switch 124, the second switch 126 and the third switch 128 to provide the first dynamic bias voltage VD1, the second dynamic bias voltage VD2 and the third dynamic bias voltage VD3 to the buffer circuit 110, so as to reduce the circuit to generate controls signals to the buffer circuit 110. And, the voltage adjust circuit 100 provides the voltage level of −3 volts and 12 volts to the display, in order to increase the brightness of the light emitting elements of the display.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A voltage adjust circuit, comprising:
    a buffer circuit, comprising a plurality of pull-up transistors and a plurality of pull-down transistors, wherein the pull-up transistors are electrically coupled between an output terminal of the voltage adjust circuit and a system high voltage terminal, wherein the pull-down transistors are electrically coupled between the output terminal of the voltage adjust circuit and a system low voltage terminal, wherein the pull-up transistors comprises two adjacent pull-up transistors, wherein the pull-down transistors comprises two adjacent pull-down transistors;
    a level shifter, configured to generate a plurality of control signals according to a input signal;
    a bias circuit, electrically coupled between the level shifter and the buffer circuit, wherein the bias circuit is configured to successively enable the pull-up transistors or the pull-down transistors according to the control signals, such that a voltage level of the output terminal is switched between a voltage level of the system high voltage terminal and a voltage level of the system low voltage terminal; and
    a cross-voltage-suppression circuit, electrically coupled to the pull-up transistors and the pull-down transistors, wherein the cross-voltage-suppression circuit is configured to suppress transient and static voltage stress between two terminals of the pull-up transistors or the pull-down transistors in response to switching the voltage level of the output terminal between the voltage level of the system high voltage terminal and the voltage level of the system low voltage terminal, wherein the cross-voltage-suppression circuit comprises:
    a pull-up-suppression transistor, with a drain terminal and a source terminal respectively coupled to a source terminal and a gate terminal of one of the two adjacent pull-up transistors, with a gate terminal coupled to a gate terminal of the other one of the two adjacent pull-up transistors; and
    a pull-down-suppression transistor, with a drain terminal and a source terminal respectively coupled to a source terminal and a gate terminal of one of the two adjacent pull-down transistors, with a gate terminal coupled to a gate terminal of the other one of the two adjacent pull-down transistors.

2. The voltage adjust circuit of claim 1, wherein,
    the pull-up-suppression transistor with the drain terminal coupled to the source terminal of the one of the two adjacent pull-up transistors, with the source terminal coupled to the gate terminal of the one of the two adjacent pull-up transistors; and
    the pull-down suppression transistor, with the drain terminal coupled to the source terminal of the one of the two adjacent pull-down transistors, with the source terminal coupled to the gate terminal of the one of the two adjacent pull-down transistors.

3. The voltage adjust circuit of claim 2, wherein the voltage level of the system low voltage terminal has a negative value.

4. The voltage adjust circuit of claim 2, wherein the bias circuit further comprises:
    a plurality of voltage divider transistors, electrically coupled between the system high voltage terminal and the system low voltage terminal, wherein the voltage divider transistors are configured to provide a first static bias voltage to a first node and provide a second static bias voltage to a second node; and
    an inner bias circuit, electrically between the first node and the second node, wherein the inner bias circuit is configured to provide a plurality of inner bias voltages to the buffer circuit.

5. The voltage adjust circuit of claim 4, wherein the bias circuit further comprises a plurality of switches, the switches electrically between the system high voltage terminal and the system low voltage terminal, wherein the level shifter provides the control signals to the switches according to the input signal, such that the switches provide a plurality of dynamic bias voltages to the buffer circuit and the inner bias circuit according to the control signals.

6. The voltage adjust circuit of claim 5, wherein the switches comprises:
    a first switch, electrically coupled between the system high voltage terminal and the first node, wherein the first switch is configured to provide a first dynamic bias voltage of the dynamic bias voltages to a gate terminal of one of the pull-up transistors closest to the system high voltage terminal according to one of the control signals; and a second switch, electrically coupled between the second node and the system low voltage terminal, wherein the second switch is configured to provide a second dynamic bias voltage of the dynamic bias voltages to the a gate terminal of one of the pull-down transistors closest to the system low voltage terminal according to another of the control signals; and a third switch, electrically coupled between the first switch and the second switch, wherein the third switch is configured to provide a third dynamic bias voltage of the dynamic bias voltages to the inner bias circuit according to the other of the control signals.

7. The voltage adjust circuit of claim 6, wherein the pull-up transistors and the pull-down transistors of the buffer circuit are respectively enabled according to the first dynamic bias voltage, the first static bias voltage, the second dynamic bias voltage, the second static bias voltage and the inner bias voltages.

8. The voltage adjust circuit of claim 7, wherein,
when the input signal has a first logic level, the pull-up transistors are turned off according to the first dynamic bias voltage, the first static bias voltage and a part of the inner bias voltages, and the pull-down transistors are turned on according to the second dynamic bias voltage, the second static bias voltage and the other part of the inner bias voltages.

9. The voltage adjust circuit of claim 7, wherein,
when the input signal has a second logic level, the pull-up transistors are turned on according to the first dynamic bias voltage, the first static bias voltage and a part of the inner bias voltages, and the pull-down transistors are turned off according to the second dynamic bias voltage, the second static bias voltage and the other part of the inner bias voltages.

10. The voltage adjust circuit of claim 7, wherein the pull-up transistors comprises two pull-up transistors closest to the output terminal, wherein the pull-down transistors comprises two pull-down transistors closest to the output terminal, wherein the bias circuit is further comprises:
a first capacitor, electrically coupled between gate terminals of the two pull-up transistors closest to the output terminal; and
a second capacitor, electrically coupled between gate terminals of the two pull-down transistors closest to the output terminal.

11. The voltage adjust circuit of claim 7, wherein the pull-down transistors are implemented by N-type metal oxide semiconductor with deep N well, wherein deep N well of each pull-down transistors is electrically coupled to the system high voltage terminal, wherein base terminal and source terminal of each pull-down transistors are electrically coupled to each other.

12. A method, for operating a voltage adjust circuit comprising a buffer circuit and a pull-up suppression transistor, wherein the buffer circuit comprises a plurality of pull-up transistors electrically coupled in series between a system high voltage terminal and an output terminal of the voltage adjust circuit and a plurality of pull-down transistors electrically coupled in series between the output terminal of the voltage adjust circuit and a system low voltage terminal, wherein the pull-up transistors comprises two adjacent pull-up transistors, wherein the pull-up suppression transistor electrically coupled between a gate terminal and a source terminal of one of the two adjacent pull-up transistors, and wherein the method comprises:
providing an input signal;
generating a plurality of control signals according to the input signal;
enabling the pull-up transistors and the pull-down transistors successively, according to the control signals, such that a voltage level of the output terminal is switched between a voltage level of the system high voltage terminal and a voltage level of the system low voltage terminal; and
in response to switching the voltage level of the output terminal between the voltage level of the system high voltage terminal and the voltage level of the system low voltage terminal, turning on the pull-up suppression transistor according to voltage level at a gate terminal of the other one of the two adjacent pull-up transistors to suppress transient and static voltage stress between the pull-up transistors.

13. The method of claim 12, further comprising:
during a pull-up operation, successively turn off the pull-down transistors from the system low voltage terminal to the output terminal; and
during a pull-down operation, successively turn off the pull-up transistors from the system high voltage terminal to the output terminal.

14. The method of claim 12, further comprising:
generating a first dynamic bias voltage, a second dynamic bias voltage and a third dynamic bias voltage according to the control signals, respectively; and
during a pull-up operation, turning off one of the pull-down transistors closest to the system low voltage terminal according to the second dynamic bias voltage; and
during a pull-down operation, turning on one of the pull-up transistors closest to the system high voltage terminal according to the first dynamic bias voltage.

15. The method of claim 14, further comprising:
generating a plurality of static bias voltages according to the third dynamic bias voltage; and
providing the first dynamic bias voltage, the second dynamic bias voltage and the static bias voltages to gate terminals of each pull-up transistors and pull-down transistors, respectively.

16. The method of claim 15, further comprising:
during the pull-up operation, successively turn off the pull-down transistors from the system low voltage terminal to the output terminal; and
during the pull-down operation, successively turn off the pull-up transistors from the system high voltage terminal to the output terminal.

17. A method, for operating a voltage adjust circuit comprising a buffer circuit, a pull-up suppression transistor and a pull-down suppression transistor, wherein the buffer circuit comprises a plurality of pull-up transistors electrically coupled in series between a system high voltage terminal and a output terminal of the voltage adjust circuit and a plurality of pull-down transistors electrically coupled in series between the output terminal of the voltage adjust circuit and a system low voltage terminal, wherein the pull-up suppression transistor electrically coupled between a gate terminal and a source terminal of one of the pull-up transistors, wherein the pull-down suppression transistor electrically coupled between a gate terminal and a source terminal of one of the pull-down transistors, and wherein the method comprising:
providing an input signal;

generating a plurality of control signals according to the input signal;

generating a first dynamic bias voltage, a second dynamic bias voltage and a third dynamic bias voltage according to the control signals;

enabling the other one of the pull-up transistors closest to the system high voltage terminal according to the first dynamic bias voltage, and turning on the pull-down suppression transistor according to the second dynamic bias voltage; or enabling the other one of the pull-down transistors closest to the system low voltage terminal according to the second dynamic bias voltage, and turning on the pull-up suppression transistor according to the first dynamic bias voltage.

18. The method of claim 17, further comprising:

generating a plurality of static bias voltages according to the third dynamic bias voltage; and providing the first dynamic bias voltage, the second dynamic bias voltage and the static bias voltages to gate terminals of each pull-up transistors and pull-down transistors, respectively.

19. The method of claim 18, further comprising:

during a pull-up operation, turning off the other one of the pull-down transistors closest to the system low voltage terminal according to the second dynamic bias voltage; and during a pull-down operation, turning on the other one of the pull-up transistors closest to the system high voltage terminal according to the first dynamic bias voltage.

* * * * *